United States Patent [19]

Bertocchi

[11] Patent Number: 4,698,637

[45] Date of Patent: Oct. 6, 1987

[54] DEVICE FOR PULSE MODULATION AUTOMATIC CONTROL

[75] Inventor: Giuseppe Bertocchi, Vertova, Italy

[73] Assignee: International Standard Electric Corporation, New York, N.Y.

[21] Appl. No.: 259,928

[22] Filed: May 4, 1981

[51] Int. Cl.[4] .............................................. G01S 1/44
[52] U.S. Cl. .................................. 342/399; 455/126; 332/37 D
[58] Field of Search ................... 343/106 R:7.3, 17.1, 343/398, 399, 404; 332/9 R, 9 T:31 R, 31 T, 37 R, 37 D, 38; 375/60; 455/126; 364/451

[56] References Cited

U.S. PATENT DOCUMENTS

| | | | |
|---|---|---|---|
| 3,823,400 | 7/1974 | Deck | 343/106 R |
| 3,979,751 | 9/1976 | Van Den Berg | 343/106 R |
| 4,409,594 | 10/1983 | Graziani | 364/451 |

*Primary Examiner*—Theodore M. Blum
*Attorney, Agent, or Firm*—T. L. Peterson; A. D. Stolzy

[57] ABSTRACT

A device for pulse modulation automatic control, where the modulation is a combined plurality of pulse components. Each pulse component is singly controlled by a respective control voltage or current, the control voltages and/or currents being fully independent from the output demodulated pulse level and from the number, per time unit, of pulses.

9 Claims, 6 Drawing Figures

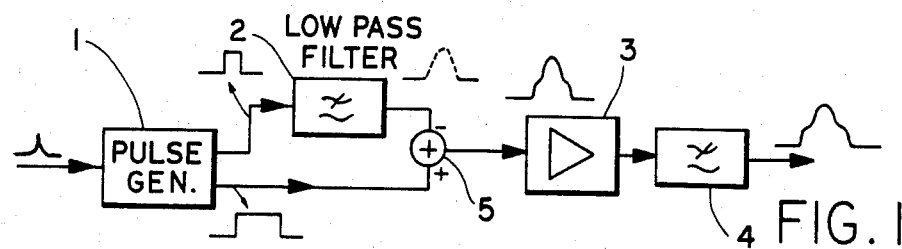
FIG. 1
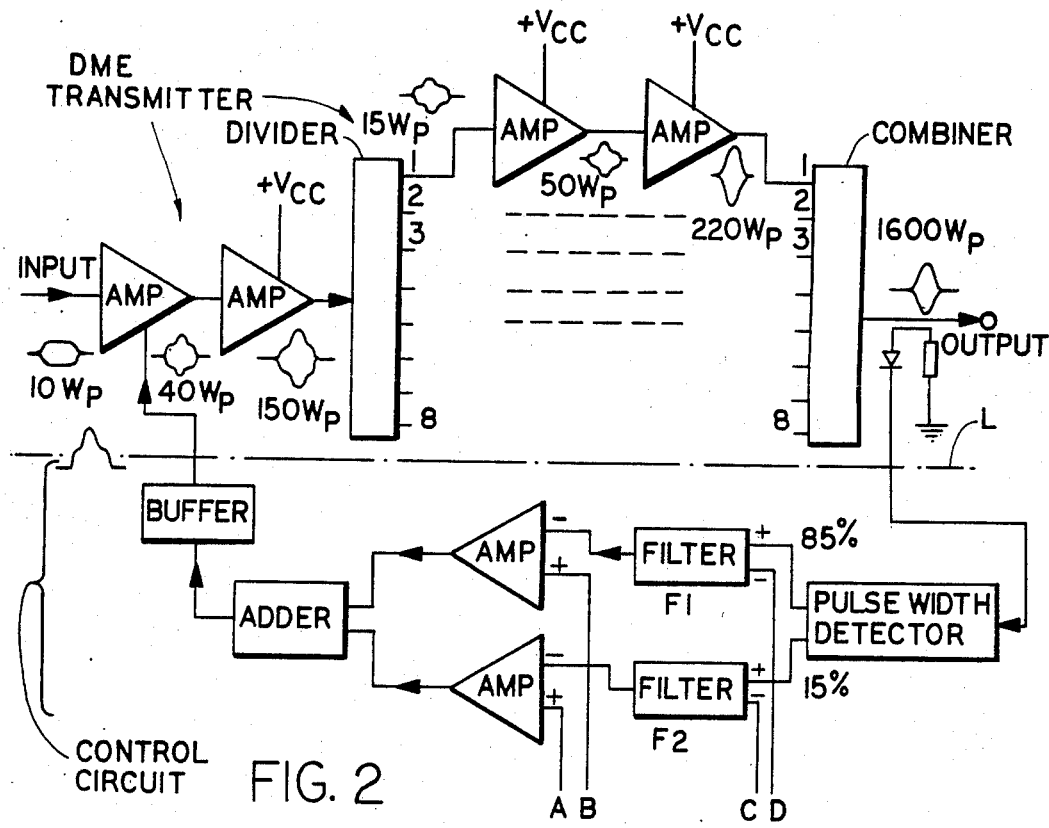
FIG. 2
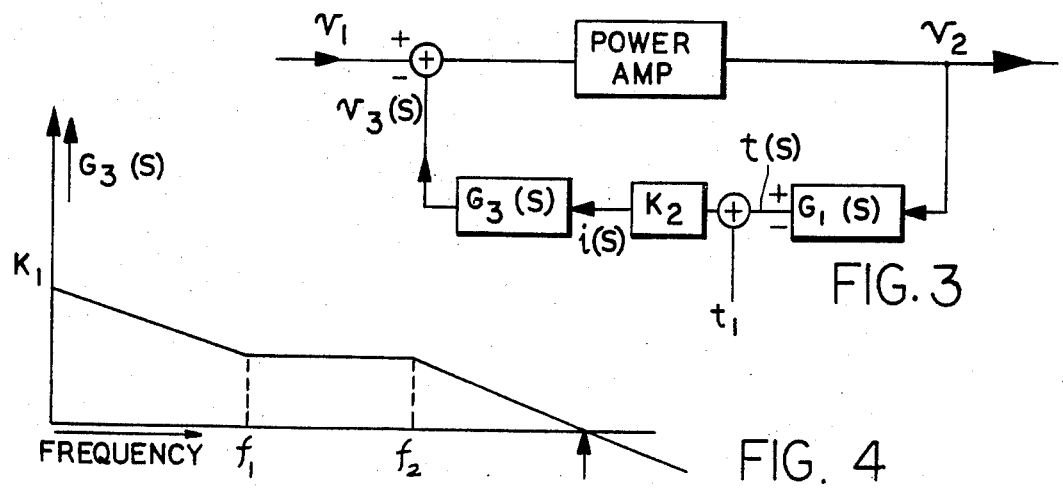
FIG. 3
FIG. 4

DEVICE FOR PULSE MODULATION AUTOMATIC CONTROL

BACKGROUND OF THE INVENTION

1. Field of the Invention

The present invention relates to a device for pulse modulation automatic control to provide the control currents or voltages which modify, continuously and automatically, the level of the signals used for producing the modulating pulse in order to obtain demodulated pulses whose durations, at different percentage levels, will remain constant.

2. Description of the Prior Art

As known, pulse transmission systems which transmit information related to pulse duration or to pulse shape itself, are extensively used. In some of those systems, the effectiveness is dependent upon the stability and the preservation of the output pulse characteristics of said equipments.

It is, however, evident to those skilled in the art, that the aforesaid characteristics are susceptible to drift due to environmental and other operating conditions. Such drifts, which are greater as the complexity of the equipments becomes higher, degrade the overall operation. In copending U.S. patent application Ser. No. 198,300 filed Oct. 20, 1980 (now U.S. Pat. No. 4,409,594), a modulation technique with automatic modulation control is disclosed. Such a technique is background to the invention and may be advantageously used as a part of the combination of the invention. That patent application is assigned to the assignee of this application.

SUMMARY OF THE INVENTION

A significant object of the invention may be said to be the provision of a device which, starting from the modulation technique disclosed in the abovementioned patent application Ser. No. 198,300 (now U.S. Pat. No. 4,409,594), compensates said drift and assures high stability of the pulse characteristics. The device, according to the invention, is also intended to augment the teachings of the invention disclosed in the abovementioned patent application as will become more apparent as this description proceeds.

It is also a task of the invention to provide a device which, used for the automatic control of pulse modulation, preserves the spectral characteristics of the pulse at an optimum value and, more specifically, maintains the pulse duration stable at various predetermined percentage levels during reception.

In the ambit of such a task, a very significant object of the invention is to provide a device which, used for the modulation automatic control, is suitable for maintaining the stability of the pulse leading edge with a consequent accuracy improvement in respect to the time delay introduced by the receiving-transmitting equipments such as a DME or TACAN airway beacon.

Still another object of the invention is to provide a device which, used for the automatic control of the pulse modulation, makes possible to obtain, at any moment and under any operating condition, optimum (maximum) output power from the transmitter.

Yet another object of the invention is to provide a device which, used for the automatic control of the pulse modulation, performs the modulation control in a way which is strictly dependent on the pulses duration times and which is contemporaneously able to modify the modulating pulses level in relation to control voltages or concepts which are generally independent of the pulses level or of the useful cycle thereof.

It can also be said that it is an object of the invention to provide a device which, used for the automatic control of the pulse modulation, supplies control voltages or currents which automatically change to raise the duration times of the output demodulated pulse, as measured at various percentages with respect to the peak, up to values which equalize the fixed duration times of the reference pulses applied to the input of the device itself.

The aforesaid and other objects which will become more apparent as this description proceeds, are achieved by a device used for pulse modulation automatic control in transmitting equipments or other RF equipments with pulse modulation, particularly in distance measuring equipments to be used for navigation aid, in which said modulating signal is obtained by adding a plurality of differently shaped components, characterized in that it includes circuit means to provide, before said components are added, a single electrical magnitude control for each component of said modulating signal, said electrical magnitudes being singly suitable to set and control said respective components level and being meanwhile fully independent from the output demodulated pulse level and from the number per time unit (repetition rate) of said output pulses.

Further characteristics and advantages of the device of the invention will become more apparent from the following detailed description of a preferred embodiment thereof illustrated by way of an illustrative non-limiting example in the accompanying drawings.

BRIEF DESCRIPTION OF THE DRAWINGS

FIG. 1 is a block diagram illustrating a system for achieving a modulating pulse signal.

FIG. 2 shows in circuit block diagram form, a pulse modulation transmitting equipment, said block diagram depicting one embodiment in which the teachings of the invention can be implemented.

FIG. 3 is a circuit block diagram illustrating the control circuitry used in the control device of the invention.

FIG. 4 plots the transfer function $G_3(s)$, relative to the circuit of FIG. 3, as a function of frequency.

DETAILED DESCRIPTION OF THE DRAWINGS

Figure 5A:
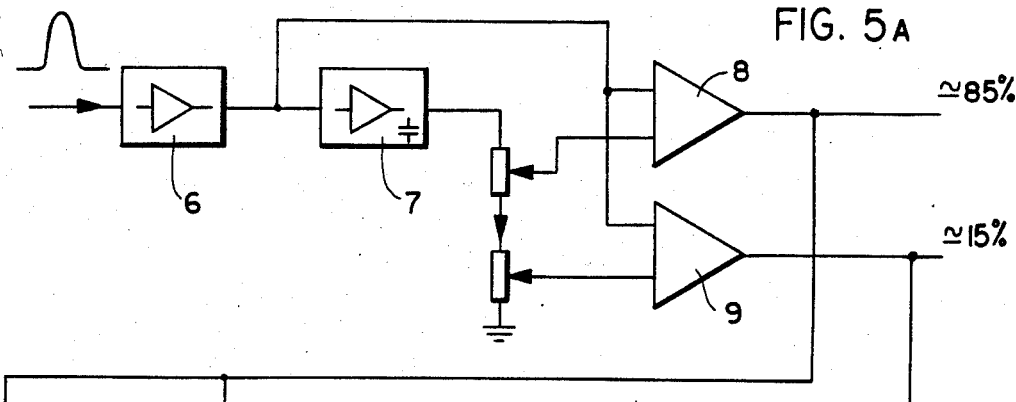
FIG. 5(a) illustrates a more detailed circuit arrangement for one implementation of the system of the block diagram shown in FIG. 3.

Referring now to the drawings, the pulse modulation control device of the invention will be described in relation to a specific transmitting equipment, i.e. to a distance measuring equipment for air navigation, such as DME or TACAN. It will be understood that the invention is not limited to this application but can be extended to any type of pulse equipment, in particular to a transmitting system providing a predetermined output pulse shape.

As is known, in DME and TACAN equipments, the transmitted pulses are Gaussian, because the Gaussian waveform occupies a minimum spectrum width for a given wave (pulse) energy; that is a Gaussian transmission has the advantage of having a compact spectrum.

The modulating pulse which, as we have seen, consists of a video frequency Gaussian pulse, is superimposed over wider pulse ("pedestal pulse"), see FIG. 1, for the following purposes:

1. To reach a zone in which the modulation becomes linear or quasi-linear and meanwhile guarantees a determined On/Off or modulation intermittence ratio;
2. to provide, at the modulated stage output, an RF signal having such a power and shape as to exceed the conduction threshold of the subsequent three cascade connected unmodulated amplifiers;
3. and to maintain the RF input levels of the three unmodulated cascade connected amplifiers so that the class C amplification of said stages remains linear, or quasi-linear, in the region related to the pulse superimposed on the pedestal and likewise in such a way that, in connection with the pulse peak, saturation of the higher power stage is reached.

Of course, such characteristics do not remain constant as the transmitter operating condition change, e.g. because of temperature, carrier frequency and other changes; but the modulation control device of the present invention is able to compensate, as it will be seen herebelow, slow variations, over some tens of milleseconds, of the effects relative to the three points set forth hereinabove.

The pilot square pulse level of the pedestal pulse is automatically controlled to maintain a fixed 5 μs width at about 15% of the output demodulated pulse and, at the same time, the pilot square pulse level of the Gaussian pulse is automatically controlled to remain fixed at 2 μs in width at about 85% of the output demodulated pulse.

In such a way, the transmitted pulse shape is automatically controlled with the advantages of:

(a) spectral characteristics preservation;
(b) pulse leading edge stability with consequent improved accuracy of the time delay introduced by the ground radio beacon; and
(c) capability for obtaining at any instant and under any operating condition, the maximum output power of the transmitter.

Referring now to the block diagram of FIG. 1, the device of the present invention is based on the principle that the modulating signal, produced, e.g. by known logic circuitry schematically indicated in pulse generator block 1, is obtained by adding in adder 5 two or more suitably shaped components, e.g. the two illustrated rectangular signals of different durations, one of which is suitably filtered, e.g. in low-pass filter 2. A driver amplifier 3 and output filter 4 produce the indicated pulse shape.

According to the invention and as will be described in more detail hereinbelow, the level of these components is defined and controlled, before they are filtered and added, by control signals (voltages or currents), one for each component. Advantageously, the control voltages or currents are fully independent from the output demodulated pulse level and from the number of pulses per time unit or useful cycle, but they are responsive only to the pulse duration times. The closed-loop type control circuit, relative to each component of composite modulating signal, is illustrated in FIG. 3, in which:

$V_1$ indicates the fixed pilot signal,
$V_2$ indicates the detected signal,
$t(s)$ is the detected pulse width,
$t_1$ is a reference width or time,
$i(s)$ is the so-called "pump current",
$V_3(s)$ is the control voltage,
$G_i(s)$ indicates the width detector, and
$G_3(s)$ indicates the "pump filter" which, by its transfer function, produces system stability as a function of frequency.

FIG. 4, illustrates the variations of the transfer function modulus $G_3(s)$ just in relation to the frequency, said modulus remaining constant between frequencies f1 and f2.

In FIG. 5(a) there is disclosed, by way of an illustrative but not limitative example, a more detailed diagram of the control device according to the invention. From this figure it can be seen how the output demodulated pulse is peak detected in block 7 after amplification in 6, and how the resulting signal is applied to the two threshold comparators 8 and 9 which detect the pulse width.

As it will be apparent to those skilled in the art, this permits width detection independent of overall pulse levels which is an essential condition for a FAIL-SOFT transmitter operation, since the overall levels may change, as previously stated. Thus the pulse duration times are not allowed to change.

Figure 5B:
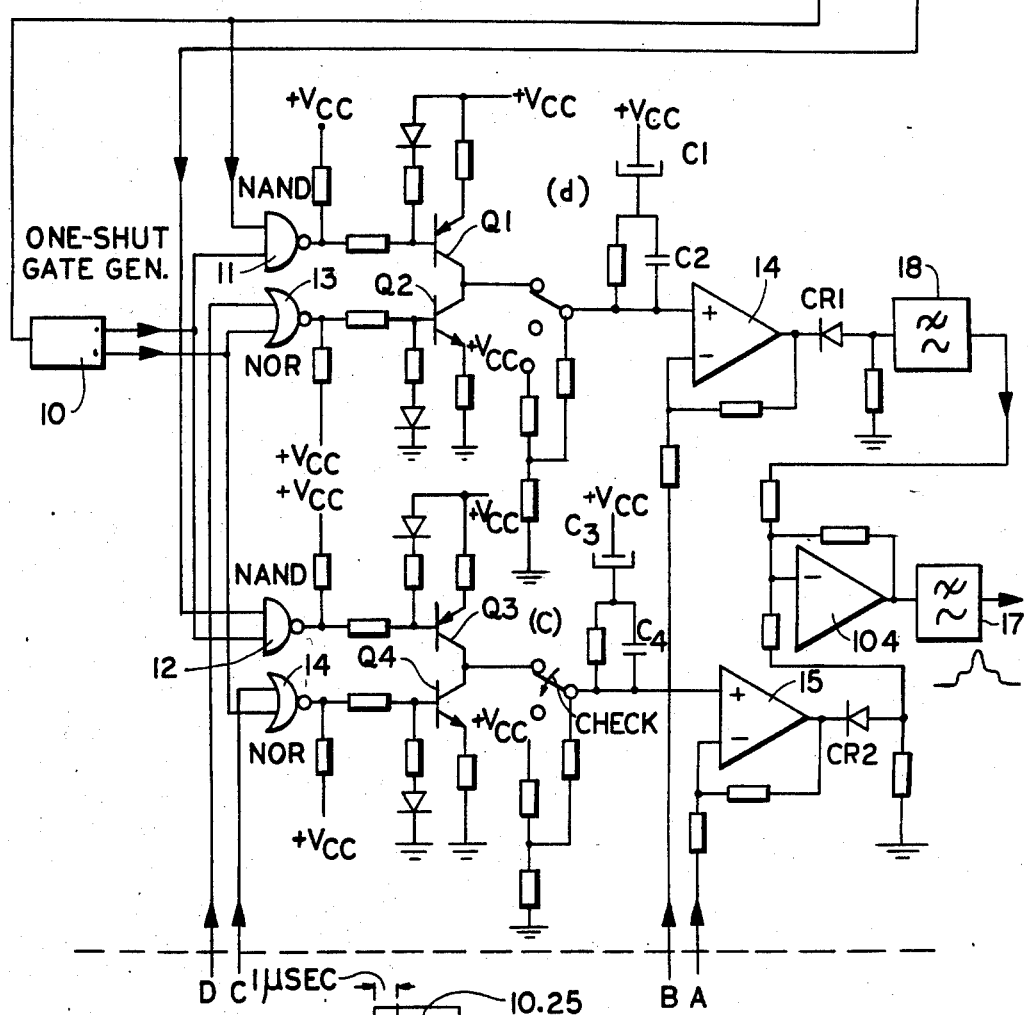
FIG. 5(b) depicts significant pulse waveforms relating to FIG. 5(a) as identified.
Figure 5B:
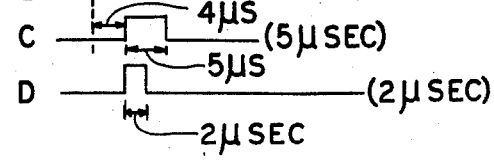

The discharge of the two pump filters occurs, in case of the DME chosen by way of example, and as it has already been seen hereinbefore, during the time equal to the detected pulse width, at 15% and at 85%, respectively; on the contrary, the charge occurs during a time which is equal to the reference pulses, in this case of 5 and 2 μs, respectively. Note that in FIG. 5, as well in FIG. 2:

A is the driving pulse of the pedestal
B is the driving Gaussian pluse
C is the sample pulse (5 μs duration) of the pedestal
D is the sample pulse (2 μs duration) of the Gaussian These signals are produced by conventional video frequency rectangular pulse generators, the A thru D signals being as depicted in FIG. 5(b).

The two voltages, obtained by the two "pump filters" 17 and 18 modify, through the operational amplifiers 15 and 16, the level of the pedestal driving pulse and of the Gaussian pulse, respectively. The connection of the control circuit occurs upon appearance of the demodulating signal through the "one shot" 10 which activates the NAND (11 and 12) and NOR (13 and 14) gates.

In FIG. 2, below the dashed line L, the control circuit of the invention is shown functionally connected to a known DME transmitter schematically represented. As seen, and as shown, the pilot square pulse level of the Gaussian pulse is indeed automatically controlled to maintain fixed at 5 μs the width at about 15% of the output demodulated pulse and, at the same time, the pilot square pulse level of the Gaussian pulse is automatically controlled to maintain fixed at 2 μs, the width at about 85% of the output demodulated pulse.

In accordance with the foregoing, a device has been disclosed which automatically modifies the pulse modulation signal of a transmitter or other RF (or pulse) equipments in such a way to maintain the output demodulated pulse durations stable at various fixed percentage levels. The modulating signal has been generated by adding two or more components which are suitably shaped and filtered; the level of such components, according to the invention, is set and controlled before they are added and filtered, by single control voltages and currents, one for each component.

Such control voltages are fully independent from the output demodulated pulse level and from the number of pulses per time unit being responsive to the pulses durations only.

The invention includes width detection circuitry independent of signal level, active filter circuitry which, as it has been seen, provides a voltage which is independent of the number of pulses and which depends only upon the pulse width, and amplification circuitry which changes the pulses level, under the control of a suitable voltage or current applied to operational amplifiers 15 and 16 at their (+) inputs.

While the invention has been described referring to a specific embodiment thereof and to a specific use in a DME equipment, it should be kept in mind that the invention is susceptible to modifications, variations and applications, all falling within the inventive scope. For example, although the previous description made specific reference to two parameters (in time) of the pulse, it will be clear to those skilled in the art that the device of the invention may be easily fitted for simultaneously processing of N parameters provided that width detection circuitry with N outputs, N active filters and N amplifiers, each controlled by a voltage, is provided.

What is claimed is:

1. A device for pulse modulation automatic control for use in pulse equipments or radio frequency equipments including pulse modulation, such as distance measuring equipments used for air navigation suitable to accept rectangular reference pulses of fixed duration, in which the modulating signal is obtained by adding a plurality of differently shaped pulse components each having a level controlled by said reference pulses, including circuit means to provide, before said components are added, electrical amplitude control for each of said components of said modulating signal in response to said reference pulses and pulse width detected radio frequency pulses at predetermined percentages of peak level, said electrical amplitude control being discretely effective to set and control said component levels and being continuously variable and becoming stable only when the pulse widths of the pulse width detected pulse, at said predetermined percentages of peak level, are equal to the widths of said reference pulses.

2. A control device as claimed in claim 1, characterized in that said circuit means include interconnected and functionally cooperating pulse width detector means for producing pulse width modulated pulses from said radio frequency pulses from the level of detected radio frequency pulses transmitted, and filter means responsive to said detector means, said filter means being suitable to discharge for a respective time equal to the detected pulse width and suitable to charge for a respective time equal to the respective sample pulses duration, said filter means providing, through differential amplifier means, electrical magnitudes to modify said pulses level to a predetermined value.

3. A control device as claimed in claim 1, in which said plurality of components is N and said circuit means include:

pulse width detector means for producing pulse width modulated pulses from said radio frequency pulses with N pulse width modulated outputs independent of the level of the pulses to be controlled, N active filter means, each coupled to receive a different one of said N pulse width modulated outputs, and N amplifier means coupled to receive the output of a different one of said filters, each being controlled by a respective control signal.

4. A device as claimed in claim 3, in which said circuit means, providing said N electrical amplitudes, are automatically controlled to raise the output pulse duration times of the equipments to be controlled, measured at N different percentage levels, to values equal to the fixed durations of N rectangular reference pulse signals.

5. A control device as claimed in claim 3, characterized in that N=2.

6. A device for pulse modulation automatic control for use in pulse equipment and pulse modulated radio frequency equipment, such as DME, comprising:

first means for generating a modulating pulse by adding a plurality of differently-shaped pulse components;

second means for independently controlling the electrical level of each of said pulse components prior to said adding of said pulse components;

third means responsive to said modulating signal for generating a plurality of control signals each as a function of the duration of said modulating signal at a predetermined level; and fourth means responsive to said control signals and to reference pulses characteristic of desired parameters of modulated radio frequency pulses for controlling a corresponding pulse component amplitude within said second means.

7. The device according to claim 6, further defined in that said third means is responsive to said modulated pulse duration at each corresponding predetermined level and said control signals are generated substantially independent of the amplitude and repetition rate of said modulating pulse.

8. In a radio-frequency pulse transmission system, such as used in distance measuring equipments for air navigation, pulse modulation with automatic control for modulation of the radio-frequency pulse responsive to a combined plurality of pulse components, each pulse component being singly controlled by a respective control pulse, and each control pulse being fully independent of the transmitted radio-frequency pulse level and repetition rate, the combination comprising means for detecting the transmitted radio-frequency pulse width at N predetermined amplitudes to obtain N rectangular pulses of predetermined amplitude corresponding in duration to said transmitted pulse widths at N predetermined amplitudes, means responsive to said N rectangular pulses and N parameters for producing N control signals, means responsive to said N control signals for controlling the amplitude of N reference pulses separately in accordance with different ones of said N parameters to produce amplitude controlled reference pulses, means for generating a modulating signal by superimposing said amplitude controlled reference pulses to produce a composite modulation signals, and means responsive to said composite modulation signal for modulating said radio frequency pulse.

9. The combination as defined in claim 8 wherein N is equal to 2.

* * * * *